United States Patent
Seethamraju et al.

(10) Patent No.: US 10,164,643 B2
(45) Date of Patent: Dec. 25, 2018

(54) COMPENSATING FOR TEMPERATURE-DEPENDENT HYSTERESIS IN A TEMPERATURE COMPENSATED CRYSTAL OSCILLATOR

(71) Applicant: Silicon Laboratories Inc., Austin, TX (US)

(72) Inventors: Srisai R. Seethamraju, Nashua, NH (US); Joseph D. Cali, Nashua, NH (US); Rajesh Thirugnanam, Nashua, NH (US); Richard J. Juhn, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 124 days.

(21) Appl. No.: 15/261,239

(22) Filed: Sep. 9, 2016

(65) Prior Publication Data

US 2018/0076819 A1    Mar. 15, 2018

(51) Int. Cl.
| | | |
|---|---|---|
| *H03L 1/02* | (2006.01) | |
| *H03L 1/04* | (2006.01) | |
| *H03B 5/30* | (2006.01) | |
| *H03L 7/093* | (2006.01) | |

(Continued)

(52) U.S. Cl.
CPC ............ *H03L 1/04* (2013.01); *H03B 5/30* (2013.01); *H03L 1/022* (2013.01); *H03L 1/026* (2013.01); *H03L 1/027* (2013.01); *H03L 1/028* (2013.01); *H03L 7/093* (2013.01); *H03L 7/099* (2013.01); *H03L 7/197* (2013.01)

(58) Field of Classification Search
CPC ... H03B 5/04; H03B 5/30; H03B 5/32; H03B 5/323; H03B 5/326; H03B 5/34; H03B 5/36; H03B 5/362; H03B 5/364; H03B 5/366; H03B 5/368; H03L 1/02; H03L 1/021–1/023; H03L 1/025–1/028; H03L 1/04; H03L 7/093; H03L 7/099
USPC .......................................... 331/66, 158, 176
See application file for complete search history.

(56) References Cited

U.S. PATENT DOCUMENTS

| | | | | |
|---|---|---|---|---|
| 4,560,959 A | * | 12/1985 | Rokos | G05F 3/225 331/116 R |
| 4,851,789 A | * | 7/1989 | Dobos | H03L 1/02 331/108 B |
| 4,906,944 A | | 3/1990 | Frerking | |

(Continued)

OTHER PUBLICATIONS

Stakvik, J. "Identification, Inversion and Implementation of the Preisach Hysteresis Model in Nanopositioning," NTNU-Trondheim Norwegian University of Science and Technology, Jun. 2014, 169 pages.

(Continued)

*Primary Examiner* — Levi Gannon
(74) *Attorney, Agent, or Firm* — Zagorin Cave LLP

(57) ABSTRACT

Hysteresis causes the temperature dependent frequency characteristic of the crystal of a crystal oscillator to be different when the temperature is rising from a previous colder state and when the temperature is falling from a hotter state. A rising temperature-to-frequency mapping polynomial and a falling temperature-to-frequency mapping polynomial are generated and their evaluations are weighted based on a current temperature and past temperature(s). The weighted evaluations are combined and used in temperature-based frequency compensation of the crystal oscillator.

23 Claims, 7 Drawing Sheets

(51) Int. Cl.
*H03L 7/099* (2006.01)
*H03L 7/197* (2006.01)

(56) References Cited

U.S. PATENT DOCUMENTS

| | | | |
|---|---|---|---|
| 5,081,431 | A | 1/1992 | Kubo |
| 5,182,528 | A | 1/1993 | Zuta |
| 6,271,736 | B1 | 8/2001 | Kim |
| 6,549,082 | B2 | 4/2003 | Ipek et al. |
| 6,784,756 | B2 | 8/2004 | Villella |
| 6,888,763 | B1 * | 5/2005 | Guo .................. G11C 5/145 |
| | | | 331/175 |
| 7,525,392 | B2 | 4/2009 | Tarng |
| 9,356,606 | B2 | 5/2016 | Caffee |
| 9,602,110 | B1 | 3/2017 | Caffee |
| 2001/0022539 | A1 | 9/2001 | Jakobsson |
| 2002/0011902 | A1 | 1/2002 | Ipek et al. |
| 2003/0197567 | A1 | 10/2003 | Villella |
| 2005/0128017 | A1 * | 6/2005 | Meltzer .................. H03B 5/04 |
| | | | 331/176 |
| 2006/0071718 | A1 * | 4/2006 | McCorquodale ........ H03B 5/04 |
| | | | 331/16 |
| 2010/0237955 | A1 * | 9/2010 | Mahooti .............. H03K 3/0231 |
| | | | 331/66 |
| 2010/0265000 | A1 | 10/2010 | Kishi |
| 2012/0286880 | A1 * | 11/2012 | Kowada .................. H03L 7/146 |
| | | | 331/34 |
| 2013/0320955 | A1 | 12/2013 | Kratyuk et al. |
| 2014/0176251 | A1 | 6/2014 | Seth et al. |
| 2014/0247095 | A1 | 9/2014 | Edwards |
| 2015/0145607 | A1 | 5/2015 | Caffee |
| 2015/0285691 | A1 | 10/2015 | Caffee et al. |

OTHER PUBLICATIONS

U.S. Appl. No. 15/259,897, filed Sep. 8, 2016, entitled "Compensating for Thermal Lag in Temperature Compensated Crystal Oscillators," naming Joseph D. Cali et al. as inventors.

* cited by examiner

```
If ((Ti-To)>Tthr)
    ++WR; --WF
Elif ((To-Ti)>Tthr)
    ++WF; --WR
```
← 300 where Ti = current measured temperature, To is temperature at last weighting event, $W_R$ is the rising polynomial, and $W_F$ is the falling polynomial

COMPENSATING FOR TEMPERATURE-DEPENDENT HYSTERESIS IN A TEMPERATURE COMPENSATED CRYSTAL OSCILLATOR

BACKGROUND

Field of the Invention

This invention relates to temperature compensated crystal oscillators and more particularly to accounting for temperature-dependent hysteresis in the frequency response of the crystal.

Description of the Related Art

Crystal oscillators are frequently used to provide a stable frequency source. However, crystal oscillators' frequency stability is affected by temperature and thus temperature compensated crystal oscillators (TCXOs) are utilized to make the frequency supplied by the TCXO more stable in the presence of temperature variations.

FIG. 1 illustrates a high level block diagram of a TCXO 100 that includes a crystal oscillator (XO) 101 (including a crystal and oscillator sustaining circuitry) and a fractional-N phase locked loop (PLL) 103 that receives as an input the crystal oscillator output and supplies a PLL output signal 104. A temperature sensor 105 senses temperature and provides temperature data to a temperature compensation circuit 107 that in turn causes a feedback divider control circuit 109 to adjust the feedback divider 111 to correct for the expected frequency variation resulting from temperature variation. The temperature compensation circuit 107 may utilize a look-up table mapping the sensed temperature to the frequency variation or a polynomial extracted from the sensed temperature and measured frequency variation profile. The temperature compensation values in the look-up table or the polynomial coefficients may be based on device characterization in which the TCXO was heated to various temperatures in order to determine the appropriate compensation factors.

While FIG. 1 provides one way to temperature compensate a crystal oscillator, further improvements in TCXOs are desirable to provide even more stable output signals.

SUMMARY OF EMBODIMENTS OF THE INVENTION

Accordingly, in one embodiment, a method includes weighting a first evaluation of a first temperature-to-frequency mapping corresponding to rising temperatures and a second evaluation of a second temperature-to-frequency mapping corresponding to falling temperatures based, in part, on temperature measurements associated with a temperature compensated crystal oscillator and generating first and second weighted evaluations. The method further includes combining the first and second weighted evaluations and generating a combined output used to compensate for temperature dependent frequency change of a crystal in the temperature compensated crystal oscillator. The temperature to frequency mappings may utilize a polynomial or frequency error data stored in a look up table.

In another embodiment, an apparatus includes weighting logic to apply a first weight to a first evaluation of a first temperature-to-frequency mapping corresponding to rising temperatures and generate a first weighted evaluation and to apply a second weight to a second evaluation of a second temperature-to-frequency mapping corresponding to falling temperatures and generate a second weighted evaluation. Weighting control logic determines the first and second weights based on temperature measurements associated with a temperature compensated crystal oscillator. A combining circuit combines the first and second weighted evaluations and generates a combined output for use in compensating for temperature dependent frequency change of a crystal in the temperature compensated crystal oscillator.

In another embodiment, a temperature compensated crystal oscillator includes a temperature sensor to generate temperature measurements associated with a temperature compensated crystal oscillator. The TCXO further includes means for weighting a first evaluation of a first temperature-to-frequency mapping corresponding to rising temperatures and a second evaluation of a second temperature-to-frequency mapping corresponding to falling temperatures, at least in part, on temperature measurements, and means for combining the weighted first and second evaluations for use in adjusting a frequency of the temperature compensated crystal oscillator.

DETAILED DESCRIPTION

A temperature compensated crystal oscillator (TCXO) uses a quartz crystal as a resonator that exhibits hysteresis based on the temperature excursion the component experiences during operation. This temperature-dependent hysteresis causes the temperature dependent frequency characteristic of the crystal to be different when the temperature is rising from a previous colder state and when the temperature is falling from a hotter state. Embodiments described herein use characterized data, e.g., from a production test environment, to inform the compensation circuitry in a feed-forward temperature compensation system.

An advantage for the embodiments described herein from a cost perspective is that the compensation approach described herein does not use feedback to compensate for the hysteresis. All characterization of a single crystal can occur prior to the component being shipped by exploiting the approaches described herein. Thus the approach is effective in feed-forward compensation systems.

Figure 1:
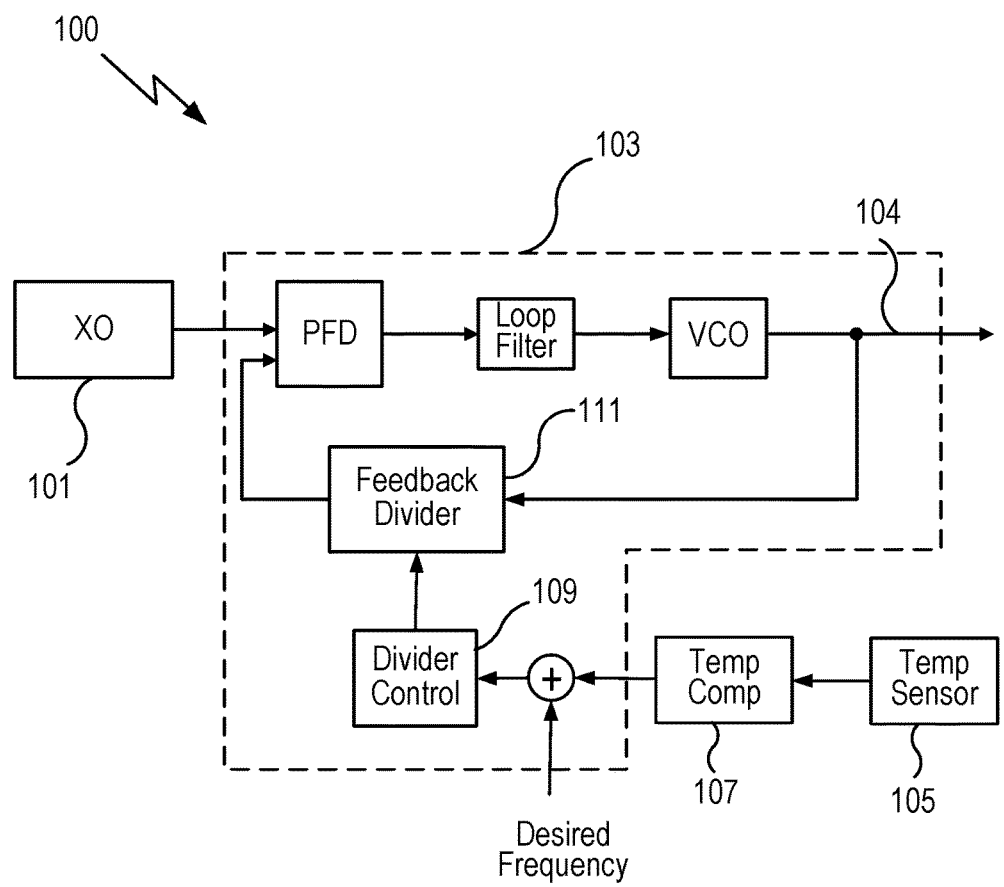
FIG. 1 illustrates a prior art temperature compensated crystal oscillator.
Figure 2:
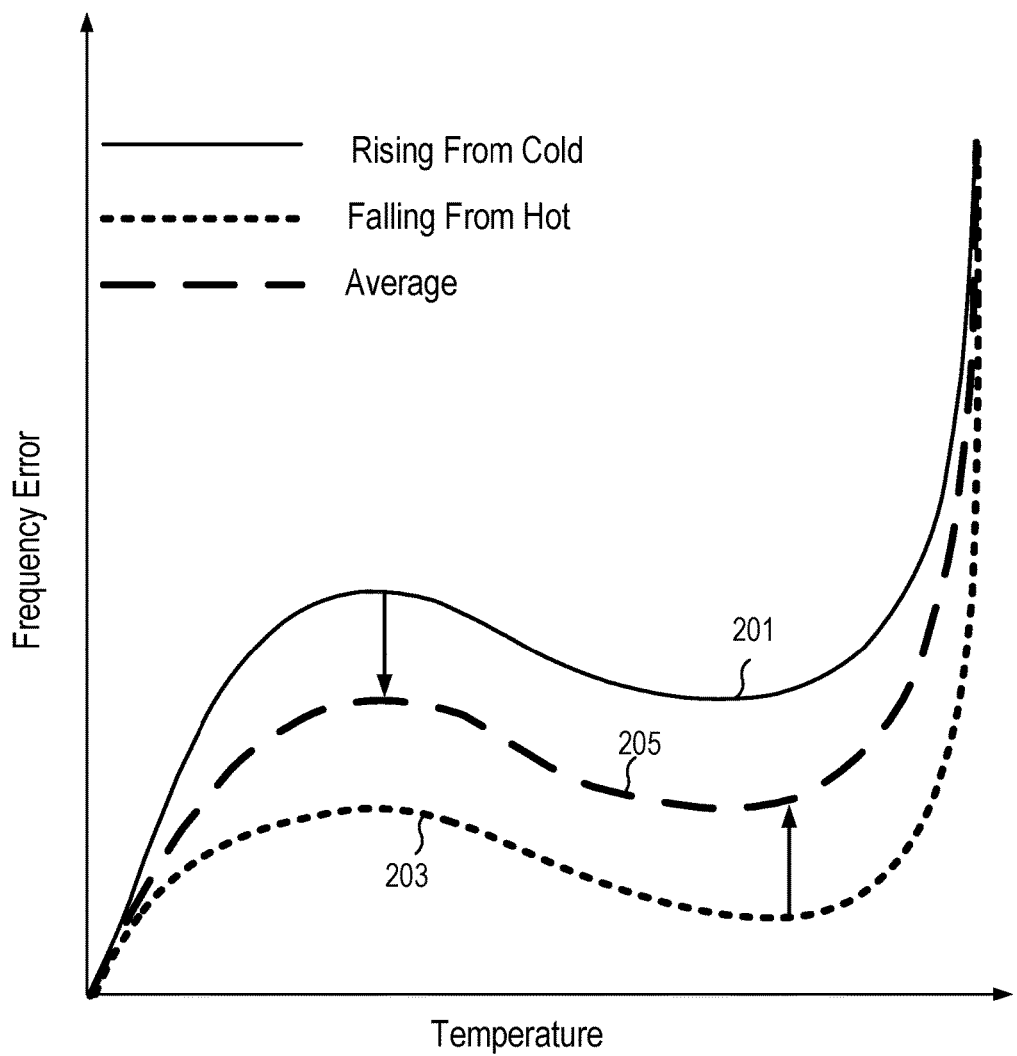
FIG. 2 illustrates how the hysteresis effect is compensated by dynamically weighting between two temperature-to-frequency mapping polynomials.

Referring to FIG. 2, the hysteresis effect is compensated by dynamically weighting between two temperature-to-frequency mapping polynomials represented by curves 201 and 203 based on the history of the temperature resulting in a weighted average of the polynomials 205. In other embodiments, the frequency error data corresponding to the curves may be stored in a lookup table. In the graph of FIG. 2, each of the polynomials is weighted equally in curve 205. One of the polynomials 201, called the "rising" polynomial, represents the temperature-to-frequency characteristic of the device when moving from a low temperature to a high temperature. The other polynomial 203, called the "falling" polynomial, represents the temperature-to-frequency characteristic of the device when moving from a high temperature to a low temperature. The temperature history data is then supplied into a weight computation algorithm that decides what mix of the polynomials to apply when the rising and falling polynomials are evaluated at a current temperature measurement.

The characterization of the individual quartz crystal is performed in a stable, highly controlled environment. In one characterization approach, a temperature loop is executed where the crystal is put into ovens and temperature cycled to exercise hysteresis effects in the TCXO. For example, the temperature of the TCXO is heated from a low temperature and the temperature/frequency pairs taken on the rising trajectory are used to extract the coefficients of the rising polynomial or used to generate frequency error data that is stored in a lookup table. In addition, the temperature of the TCXO is raised to a high temperature and then the temperature is lowered and the frequency pairs taken on the falling trajectory are used to extract the coefficients for the falling polynomial.

Figures 3A, 3B:
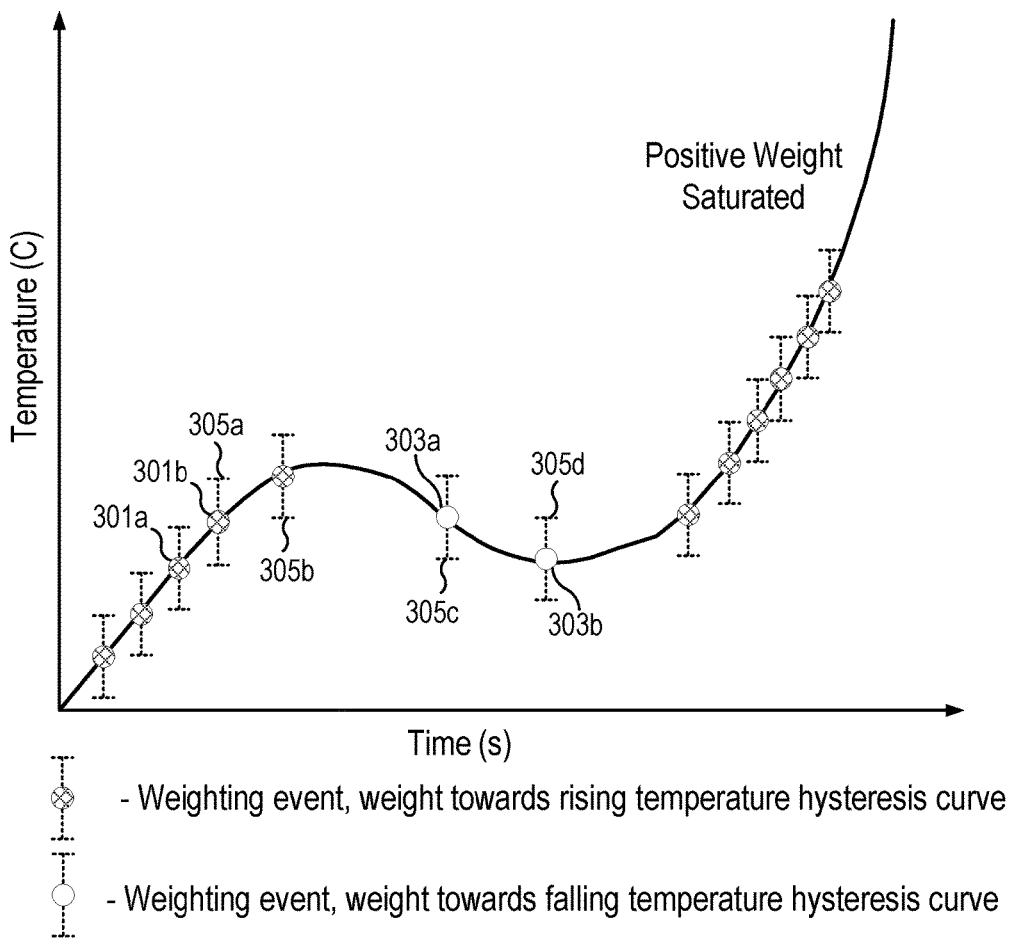
FIG. 3A illustrates pseudo code representing a weighting algorithm used by an embodiment.
FIG. 3B illustrates a graphical representation of an embodiment of a weighting algorithm.

One embodiment sets a temperature excursion threshold that creates a weight update event when triggered. Referring to FIG. 3A, the high level pseudo code 300 represents a weighting algorithm used by an embodiment. FIG. 3B represents the algorithm graphically. Thus, each temperature measurement supplied to the weighting algorithm is analyzed. Referring to FIG. 3A, if the current temperature ($T_i$) is greater than the temperature at the last weighting event ($T_o$) by an amount above a threshold ($T_{thr}$), then the weight of the evaluation of the rising polynomial ($W_R$) is increased and the weight of the evaluation of the falling polynomial ($W_F$) is decreased. If however, the weight of the current temperature is less than the temperature by a threshold amount, then the weight of the evaluation of the falling polynomial $W_F$ is increased and the weight of the evaluation of the rising polynomial $W_R$ is decreased. Rather than evaluating the polynomial, the evaluation may look up the frequency error in a look up table based on the temperature. The evaluation logic may interpolate between stored values for frequency error when the measured temperature is between stored values.

FIG. 3B illustrates the weighting algorithm graphically. Each of the positive weighting events, e.g., events 301a and 301b, causes the weighting of the rising polynomial to be increased and the weighting of the falling polynomial to be decreased. For instance, if the threshold is set to 1° C., then an excursion in the positive direction from the last weight threshold event by 1° C. will increase the weight of the rising polynomial and decrease the weight of the falling polynomial. Conversely, moving in a negative direction with respect to temperature from the last weight threshold event by 1° C. as shown at weighting events 303a and 303b results in an increase in the weight of the falling polynomial and a decrease in the weight of the rising polynomial. The dotted lines, e.g., 305a, 305b, 305c, and 305d show the threshold set for the next weight event.

Figure 4A:
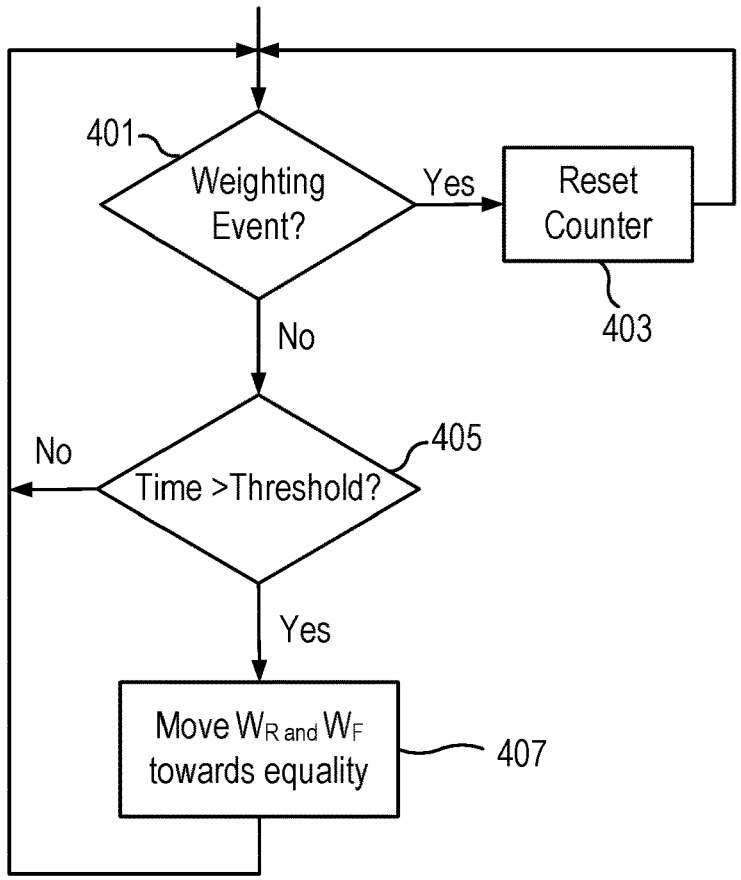
FIG. 4A illustrates an embodiment of a time dependent weight event trigger that slowly equalizes the weighting associated with the two polynomials.
Figure 4B:
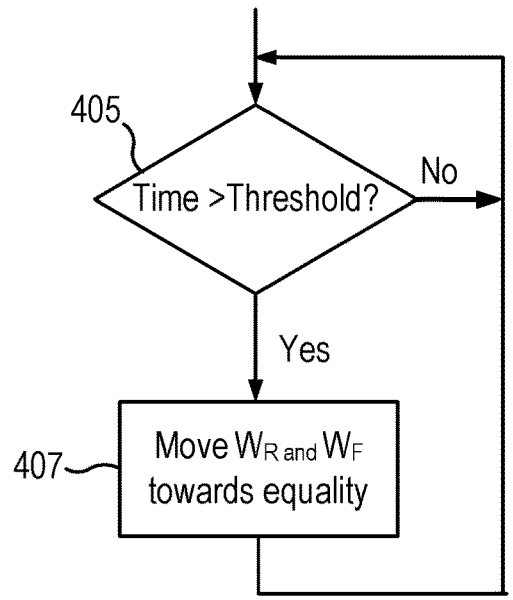
FIG. 4B illustrates another embodiment of a time dependent weight event trigger that slowly equalizes the weighting associated with the two polynomials.

In addition, referring to FIGS. 4A and 4B, the weight algorithm may respond to a time dependent weight event trigger that slowly trends the weights such that the mix of the evaluations of the rising and falling polynomials (or rising and falling look up table data) is moved towards being an equal mix. That is because hysteresis may exhibit as a dynamic effect (particularly if moisture is making the quartz crystal exhibit a hysteresis-like effect) that does not adjust the characteristic of the part permanently. The time trigger may be very long, e.g., tens of minutes or even hours making the adjustment very slow. In the embodiment shown in FIG. 4A, the time dependent weight trigger only triggers when the system has not hit a weighting event for the threshold amount of time. That is, the time trigger is reset every weighting event as shown. Thus, referring to FIG. 4A, if a weighting event occurs (from FIG. 3A or 3B) in 401 then the time counter is reset in 403. If the time has exceeded the time threshold in 405 without a weighting event occurring, the weighting algorithm moves the weighting of the evaluations of the rising and falling polynomials (or look up table data) towards equality. In other embodiments, such as shown in FIG. 4B, the time dependent weighting may operate independently of weighting events and move the weighting towards equality in 407 if the time threshold is exceeded in 405. That is the time counter is independent of weighting events in that it is not reset by weighting events.

Figure 5:
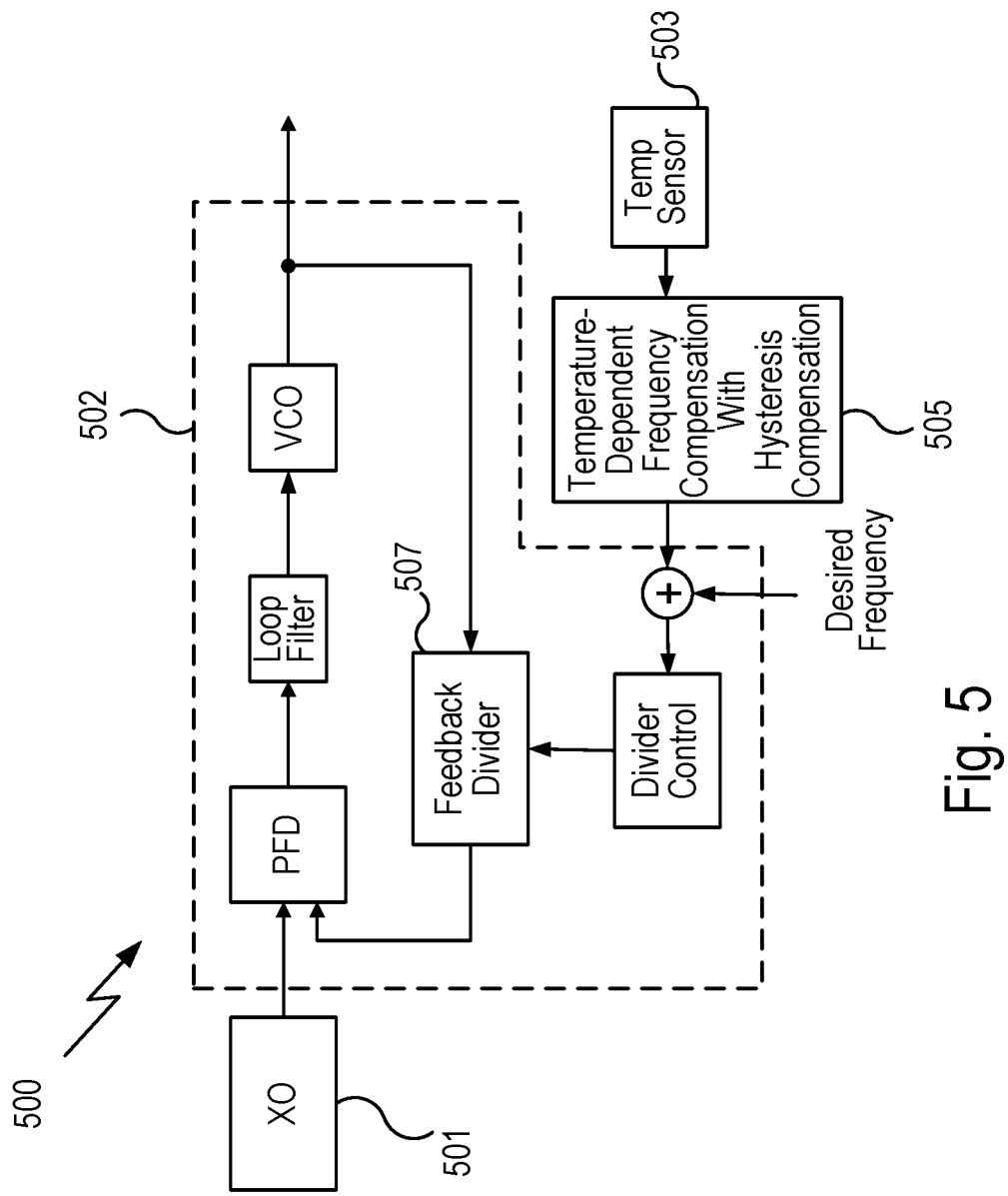
FIG. 5 is a high level block diagram of an embodiment of a TCXO that combines weighted rising and falling polynomials for use in temperature-dependent frequency compensation.

Referring to FIG. 5, a high level block diagram illustrates an embodiment of a TCXO 500 that combines weighted rising and falling polynomials for use in temperature-dependent frequency compensation. The TCXO 500 includes the crystal oscillator 501 and a phase-locked loop 502. A temperature sensor 503 supplies a temperature data to a temperature dependent frequency compensation block 505 that compensates the frequency utilizing the rising and falling polynomials described, e.g., in FIGS. 3A and 3B. The output of the compensation block may be utilized to adjust the feedback divider 507 to adjust the frequency of the output signal of the PLL.

Figure 6:
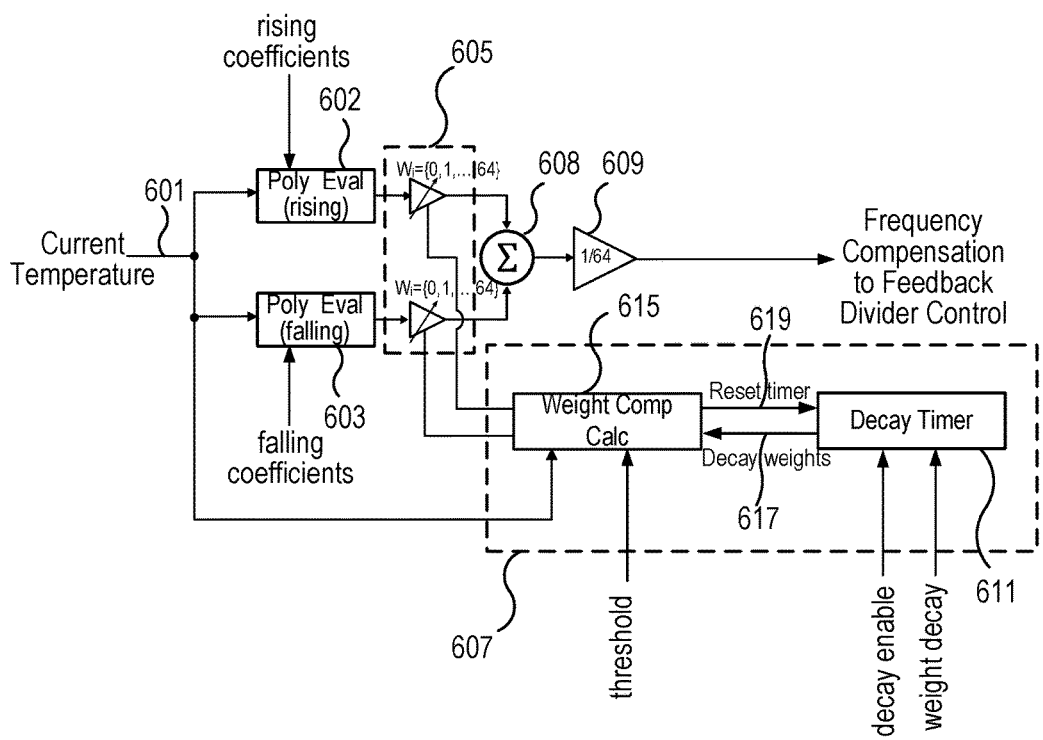
FIG. 6 illustrates an embodiment of the compensation logic that combines weighted rising and falling polynomials.

FIG. 6 illustrates an embodiment of the compensation approach that combines weighted rising and falling polynomials. The current temperature 601 is supplied from a temperature sensor (not shown in FIG. 6). The current temperature is supplied to the polynomial evaluation block 602 that generates rising polynomial data based on the rising coefficients determined, e.g., during production test and the current temperature. The rising coefficients may be stored in non-volatile memory (not shown in FIG. 6). The current temperature is also supplied to the polynomial evaluation block 603 that generates falling polynomial data based on the falling coefficients determined, e.g., during production test and on the current temperature. The falling coefficients may be stored in non-volatile memory (not shown in FIG. 6). The coefficients are then supplied to weighting logic 605, which weights the values provided by the polynomial evaluations by a weight determined by the weighting control logic 607. In the example shown, the evaluated rising polynomial supplied by block 602 is weighted by, e.g., multiplying the supplied value by a value from 0 to 64. Similarly, the evaluated falling polynomial supplied by block 603 is weighted by, e.g., multiplying the supplied value by a value from 0 to 64. Summer 608 combines the weighted values. In the embodiment, the combined values are then scaled back to a full value by dividing the combined value by 64 to return to full scale in divider block 609, which is then supplied to the divider control block to help control the feedback divider value of the PLL. Note that the combined values provide 64 times the full scale value. Thus, for an equal weighting, each evaluated polynomial may be multiplied by 32. If the rising polynomial is given more weight, e.g., the rising polynomial is multiplied by 34, the falling polynomial would then be multiplied by 30. The following equation represents the embodiment utilized in FIG. 6:

$$CompOut = \frac{CompRise \times W_R + CompFall \times W_F}{W_R + W_F} = \frac{CompRise \times W_R + CompFall \times (N - W_R)}{W_R + (N - W_R)},$$

where N is 64 in the embodiment shown in FIG. 6.

The weighting control logic 607 includes the decay time 611 and the weight compensation calculation block 615. The decay timer is a counter that counts the time shown in the flow charts of FIGS. 4A and 4B and supplies a control signal 617 to inform the weight compensation calculation block to equalize the weights when the counter has counted the time threshold. In the embodiment of FIG. 6 a reset timer signal 619 may be utilized to reset the decay timer when a weighting event occurs (or at a reset or other event). In other embodiments, such as shown in FIG. 4B, the decay timer is free running and is not reset in response to a weighting event. The weight control logic 607 and the weight compensation calculation block 615 may operate in accordance with FIGS. 3A and 3B.

Figure 7:
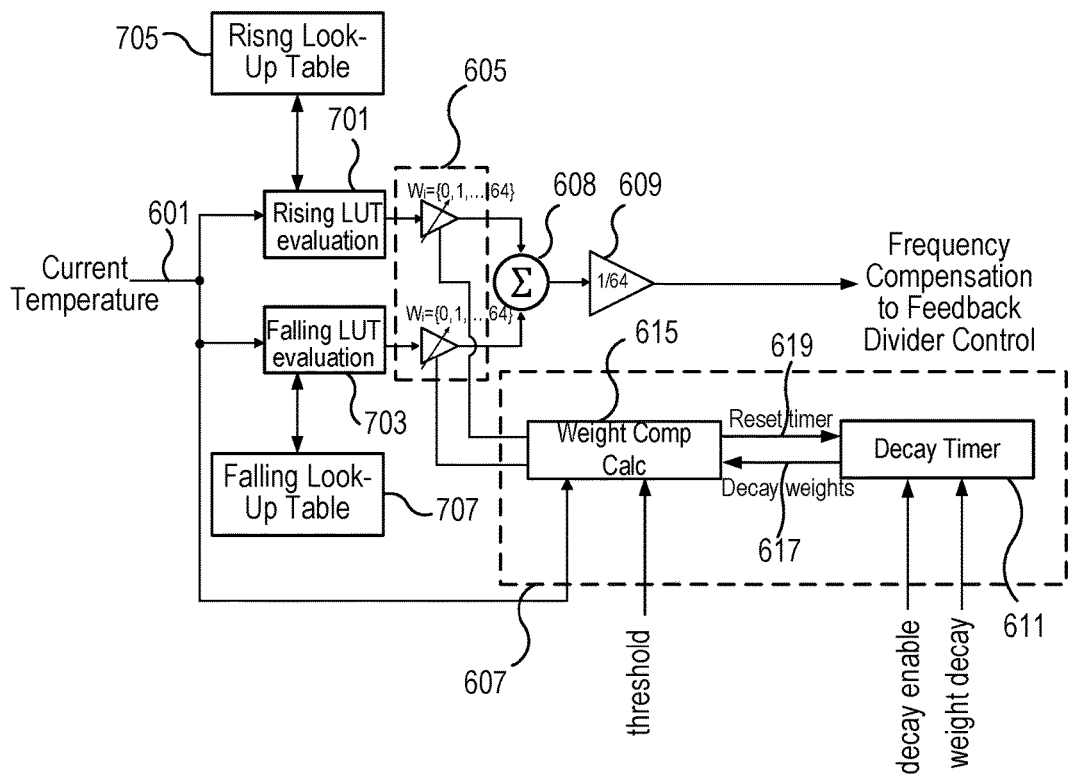
FIG. 7 illustrates an embodiment of the compensation logic that combines weighted rising and falling data in which the rising and falling data is stored in lookup tables.

FIG. 7 illustrates an embodiment in which where the frequency error data is stored in look up tables rather than as coefficients for polynomials. The current temperature 601 is supplied to the rising look up table evaluation logic 701 and the falling lookup table evaluation logic 703. The lookup table evaluation logic 701 retrieves the frequency error from the rising lookup table 705 (and interpolates as needed) based on the temperature measurement and supplies the frequency error data to weighting logic 605. Similarly, the falling lookup table evaluation logic 703 retrieves the frequency error from the falling lookup table 707 based on the temperature measurement (and interpolates as needed) and supplies the frequency error data to weighting logic 605.

While shown as separate blocks, the functionality described in FIGS. 6 and 7 and shown in various graphs, flow charts, and pseudo code herein may be implemented in part or in whole in programmed logic such as a microcontroller, in discrete digital logic, including counters, multipliers, and state machines, or in any combination of hardware and/or software operating on a programmed processor, such as a microcontroller, which is appropriate for the particular embodiment.

Thus, various aspects have been described related to addressing hysteresis effects for temperature-dependent frequency compensation for temperature compensated crystal oscillators. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    weighting a first evaluation of a first temperature-to-frequency mapping for rising temperatures and a second evaluation of a second temperature-to-frequency mapping for falling temperatures based, in part, on temperature measurements associated with a temperature compensated crystal oscillator and generating first and second weighted evaluations;
    combining the first and second weighted evaluations and generating a combined output; and
    compensating for temperature dependent frequency change of a crystal in the temperature compensated crystal oscillator using the combined output.

2. The method as recited in claim 1 wherein the first temperature-to-frequency mapping is a rising polynomial and represents a first temperature to frequency characteristic of the crystal when moving from a first temperature to a second temperature higher than the first temperature and the second temperature-to-frequency mapping is a falling polynomial and represents a second temperature to frequency characteristic of the crystal when moving from a third temperature to a fourth temperature lower than the third temperature.

3. The method as recited in claim 1, further comprising:
    determining a first difference between a current temperature measurement and a previous temperature measurement;
    comparing the first difference to a rising threshold;
    if the first difference is above the rising threshold, increasing a weight of the first evaluation corresponding to the rising temperatures by a first amount.

4. The method as recited in claim 3, further comprising:
    decreasing a weight of the second evaluation corresponding to the falling temperatures by an amount corresponding to the first amount.

5. The method as recited in claim 3, further comprising:
    determining a second difference between the previous temperature measurement and the current temperature measurement;
    comparing the second difference to a falling threshold;
    if the second difference is above the falling threshold resulting in another weighting event, increasing a weight of the second evaluation corresponding to the falling temperatures by a second amount.

6. The method as recited in claim 5, further comprising:
    decreasing a weight of the first evaluation corresponding to the rising temperatures by an amount corresponding to the second amount.

7. The method as recited in claim 5, wherein the previous temperature measurement was a temperature at a most recent weighting event.

8. The method as recited in claim 2, further comprising:
    adjusting the weighting of the first and second evaluations corresponding to the rising and falling temperatures responsive to a predetermined passage of time to move weighting of the first and second evaluations, corresponding respectively to the rising temperatures and the falling temperatures, towards an even weighting.

9. The method as recited in claim 8, further comprising:
    determining the predetermined passage of time using a counter that is independent of weighting events.

10. The method as recited in claim 8, further comprising:
    determining the predetermined passage of time using a counter; and
    resetting the counter at each weighting event to begin counting the predetermined passage of time responsive to each weighting event.

11. An apparatus comprising:
    weighting logic to apply a first weight to a first evaluation of a first temperature-to-frequency mapping corresponding to rising temperatures and generate a first weighted evaluation and to apply a second weight to a second evaluation of a second temperature-to-frequency mapping corresponding to falling temperatures and generate a second weighted evaluation;

weighting control logic to determine the first and second weights based on temperature history measurements associated with a temperature compensated crystal oscillator; and a combining circuit to combine the first and second weighted evaluations and generate a combined output for use in compensating for temperature dependent frequency change of a crystal in the temperature compensated crystal oscillator.

12. The apparatus as recited in claim 11 further comprising:

a phase-locked loop including a feedback divider having a divide ratio determined, based in part, on the combined output.

13. The apparatus as recited in claim 11 wherein the first temperature-to-frequency mapping is a rising polynomial and represents a first temperature to frequency characteristic of the crystal when moving from a first temperature to a second temperature higher than the first temperature and the second temperature-to-frequency mapping is a falling polynomial and represents a second temperature to frequency characteristic of the crystal when moving from a third temperature to a fourth temperature lower than the third temperature.

14. The apparatus as recited in claim 11 wherein the first temperature-to-frequency mapping is first frequency error data stored in a first lookup table and represents a first temperature to frequency characteristic of the crystal when moving from a first temperature to a second temperature higher than the first temperature and the second temperature-to-frequency mapping is second frequency error data stored in a second lookup table and represents a second temperature to frequency characterisitic of the crystal when moving from a third temperature to a fourth temperature lower than the third temperature.

15. The apparatus as recited in claim 11, wherein the weighting control logic is further configured to:

determine a difference between a current temperature measurement and an earlier temperature measurement;

compare the difference to a rising threshold; and if the difference is above the rising threshold, increase the first weight of the first evaluation.

16. The apparatus as recited in claim 15, wherein the weighting control logic is further configured to decrease the second weight of the second evaluation by an amount corresponding to the increase of the first weight of the first evaluation.

17. The apparatus as recited in claim 11, wherein the weighting control logic is further configured to:

determine a difference between an earlier temperature measurement and a current temperature measurement;

compare the difference to a falling threshold; and if the difference is above the falling threshold, increase the second weight of the second evaluation.

18. The apparatus as recited in claim 17, wherein the weighting control logic is further configured to decrease the first weight of the first evaluation by an amount corresponding to the increase of the second weight of the second evaluation.

19. The apparatus as recited in claim 15, wherein the earlier temperature measurement was a temperature measurement at a most recent weighting event.

20. The apparatus as recited in claim 11, wherein the weighting logic is further responsive to passage of a predetermined time period to adjust the first and second weights of the respective first and second evaluations towards an even weighting.

21. The apparatus as recited in claim 20, wherein the weighting logic further comprises:

a counter to count the predetermined time period independent of weighting events.

22. The apparatus as recited in claim 20, wherein the weighting logic further comprises:

a counter to count the predetermined time period; and wherein the counter is configured to begin counting the predetermined time period responsive to each weighting event.

23. A temperature compensated crystal oscillator comprising:

a temperature sensor to generate temperature measurements associated with the temperature compensated crystal oscillator;

means for weighting a first evaluation of a first temperature-to-frequency mapping corresponding to rising temperatures and a second evaluation of a second temperature-to-frequency mapping corresponding to falling temperatures, at least in part, on the temperature measurements; and means for combining the weighted first and second evaluations for use in adjusting a frequency of the temperature compensated crystal oscillator.

* * * * *